TRANSISTORIZED AMPLIFIER WITH COAXIAL LINE TYPE TANK CIRCUIT AND COMPENSATING CIRCUIT FOR NEUTRALIZING TRANSISTOR SUSCEPTANCE

Filed Sept. 21, 1962

INVENTORS
Willy Minner &
Klaus Bomhardt

BY Spencer & Kaye
ATTORNEYS

United States Patent Office 3,208,001
Patented Sept. 21, 1965

3,208,001
TRANSISTORIZED AMPLIFIER WITH COAXIAL LINE TYPE TANK CIRCUIT AND COMPENSATING CIRCUIT FOR NEUTRALIZING TRANSISTOR SUSCEPTANCE

Willy Minner and Klaus Bomhardt, Ulm (Danube), Germany, assignors to Telefunken Patentverwertungs-G.m.b.H., Ulm (Danube), Germany Filed Sept. 21, 1962, Ser. No. 225,204
Claims priority, application Germany, Sept. 22, 1961, T 20,813
9 Claims. (Cl. 330—27)

Figures 1, 2:
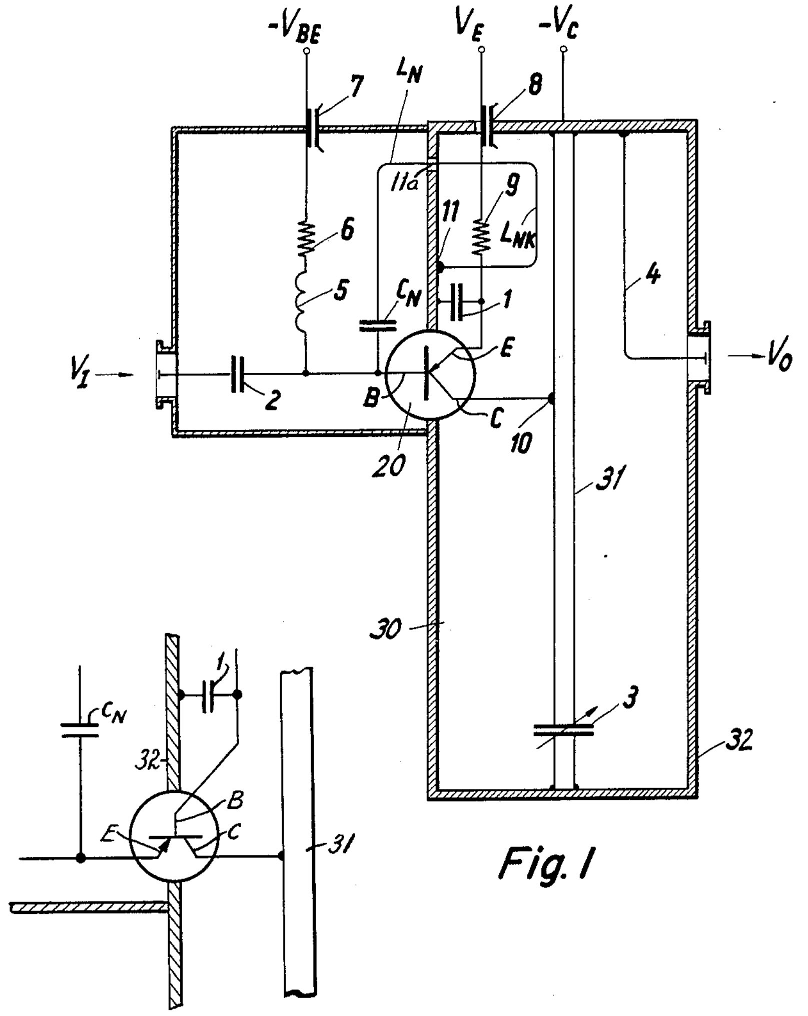

The present invention relates to a continually tunable amplifier stage of a tank circuit. Such an amplifier stage has a transistor as its active element and is intended for operation at very high frequencies.

There exist transistor circuits in which the susceptance of the transistor, which is an inherent but undesirable characteristic of the transistor, is neutralized by a suitable compensating circuit, but such compensating circuits are effective at low frequencies only. The compensating circuit normally comprises a series circuit consisting of a capacitance and an inductance, which circuit is coupled in parallel with the suseptance of the transistor appearing across the input electrodes and is fed by the ouput circuit with a voltage of the opposite phase, so as to obtain the desired neutralization.

When operating at high frequencies, as is the case, for instance, in pre-amplifiers intended for use in the UHF (ultra high frequency) range, the circuits will not only have to produce the required amplification, but they will also have to have a low noise factor. Another requirement of such circuits is that there be a large decoupling between the input and output circuits. This was heretofore possible only with very special types of tubes, such as non-reciprocal parametric amplifiers and non-reciprocal tunnel diodes. In this frequency range, the known circuits using transistors have a very small operating band and are therefore unsuited for use in a continually tunable broad band circuit arrangement. The reason that such transistorized amplifiers can operate as narrow band devices only is that the transistors have substantially higher susceptances than the special tubes heretofore used in such circuits.

While is is true that it is known, broadly, to neutralize the detrimental susceptance, the prior art does not teach any circuit in which satisfactory neutralization, in the UHF range, is accomplished over a very wide frequency band, and it is therefore an object of the present invention to provide such a circuit, namely, a circuit in which the transistor susceptance of a continually tunable amplifier operating in the UHF range, for example, 300 to 800 megacycles, is neutralized with very simple means.

When a transistor is used in the above-mentioned frequency range, it will generally have a susceptance $$-Y_{12} \approx j \cdot \frac{1}{1/\omega C - \omega L}$$

so that, in order to obtain the desired neutralization, $1/\omega C$ should be greater than $\omega L$. This means that the susceptance should be capacitive in the frequency range through which the amplifier is to be tuned.

Accordingly, the present invention resides essentially in a continually tunable amplifier stage operating at ultra high frequencies and having a coaxial line type tank circuit connected to its output, which stage has a transistor as its active element, there being, for purposes of neutralizing the susceptance of the transistor, a compensating circuit which is a series circuit composed of a capacitance and an inductance. The series circuit is coupled inductively in parallel with the susceptance of the transistor and is fed with a voltage of a phase opposite to that of the voltage appearing across the susceptance. Such an arrangement is characterized by the following features: the inductance includes a portion which constitutes a coupling loop that extends into the tank circuit in such a manner that the inductance serves simultaneously for coupling out the voltage of the opposite phase; the size of the coupling loop is small as compared to the shortest wavelength of the tuning range of the amplifier stage; and the coupling loop is arranged near the current maximum of the tank circuit, with the voltage coupled out by the coupling loop being of a phase opposite to that of the tank circuit, taken with respect to the outer conductor of the tank circuit.

Additional objects and advantages of the present invention will become apparent upon consideration of the following description when taken in conjunction with the accompanying drawing in which FIGURE 1 is a circuit diagram of the present invention showing the transistor connected in common-emitter configuration while FIGURE 2 is a fragmentary circuit diagram showing the transistor connected in common-base configuration.

Referring now to the drawing and FIGURE 1 thereof in particular, the same shows a transistor 20 having a base B, an emitter E, and a collector C, and an output circuit constituted by a λ/4 tank circuit 30 which is tunable by a capacitor 3, this output circuit being connected to the transistor without directly, i.e., the interposition of any so-called padding capacitor. The tank circuit 30 is shown as a coaxial line type tank circuit having an inner conductor 31 and an outer conductor 32. The transistor 20 is connected in common-emitter configuration. For the sake of clarity, the susceptance $-Y_{12}$ between the base and collector electrodes has not been shown. The emitter E is connected to the outer conductor 32 of the tank circuit 30 by means of a capacitor 1, so that the emitter is at the same high frequency potential as the outer conductor 32. The signal input voltage $V_I$ is applied to the base B via another capacitor 2, which, for the input frequency, approaches being a short-circuit connection while simultaneously serving to insulate the base B from the input insofar as the transmission of direct current is concerned. The amplified output voltage $V_0$ is obtained from a coupling loop 4 arranged at the current maximum of the tank circuit. The collector C is galvanically connected to the inner conductor 31 at 10. The direct current potential $-V_{BE}$ necessary for operating the transistor 20 is applied to the base B via a UHF choke coil 5 which is damped by a resistor 6, the potential $-V_{BE}$ being applied to the resistor 6 via a lead-in type capacitor 7. The emitter voltage $V_E$ is applied to the emitter E via a further lead-in type capacitor 8 and a resistor 9, the latter serving to stablize the operating point and being shunted, in so far as high frequencies are concerned, by the capacitor 1. The tank circuit 30 is, insofar as direct current is concerned, at the collector potential $-V_C$.

The compensating circuit for neutralizing the transistor susceptance comprises a capacitance $C_N$ and an inductance $L_N$. According to the prevent invention, a portion $L_{NK}$ of the inductance $L_N$ extends into the tank circuit and is galvanically connected with the outer conductor 32 at 11, this inductance portion $L_{NK}$ being fashioned as a coupling loop whose size is small as compared to the shortest wavelength of the tuning range. For example, the ratio of the diameter of the loop to the shortest wavelength is about 1 to 20. In order that the neutralization be effective throughout the entire tuning range, the inductance portion $L_{NK}$ is arranged near the current maximum, i.e., the current antinode, of the tank circuit at the upper end of the tank circuit 30 as viewed in FIGURE 1, this being the end away from the tuning capacitor 3. In the case of a λ/4 circuit, the position of this current maximum remains practially constant throughout the entire frequency range. In order to make the voltage coupled out by the coupling loop of a phase opposite to that of the voltage appearing across the susceptance, the physical positioning of the coupling loop is so selected that the end 11*a* of the loop which is not connected with the outer conductor 32 is closer to the current maximum than the end of the loop which is connected with the outer conductor at 11.

It has been found that, with an amplifier stage according to the present invention, a continuous tuning range from 300 to 800 megacycles can be obtained. At an input signal frequency of 300 megacycles the power amplification was found to be about 50, and at an input signal frequency of 800 megacycles about 18. The noise factor at a signal frequency of 800 megacycles was about 4. At a signal frequency of 300 megacycles the attenuation, with respect to the output voltage $V_0$, was 0.04, and at 800 megacycles the attenuation was 0.08.

The neutralizing circuit according to the present invention is also suitable for use in amplifiers wherein the transistor is connected in common-base configuration, as shown in FIGURE 2 wherein the same reference numerals are used as in FIGURE 1.

The circuit according to the present invention is particularly suitable for low-noise non-reciprocal input stages operated at very high frequencies, as, for example, preamplifiers of UHF tuners of television receivers.

It will be understood that the above description of the present invention is susceptible to various modifications, changes and adaptations, and the same are intended to be comprehended within the meaning and range of equivalents of the appended claims.

What is claimed is:

1. In a circuit arrangement comprising a tunable transistor amplifier and a coaxial line type tank circuit connected to the output of the amplifier, a compensating circuit for neutralizing the susceptance of the transistor, said circuit being a series circuit which is composed of a capacitance and an inductance and is coupled inductively in parallel with the susceptance of the transistor, a portion of said inductance constituting a coupling loop means which extends into the tank circuit near the current maximum thereof for coupling out a voltage whose phase is opposite to the phase of the voltage of the outer conductor of the tank circuit in consequence of which there is applied to the transistor susceptance a voltage which is of a phase opposite to that of the voltage appearing across the susceptance, the size of said coupling loop means being small as compared to the shortest wavelength of the tuning range of the amplifier, whereby the amplifier is continually tunable, at ultra high frequencies, through a wide range.

2. The combination defined in claim 1 wherein one end of said coupling loop means is connected to the outer conductor of said tank circuit, and wherein the other end of the loop means which is not connected with said outer conductor is closer to the current maximum than said first-mentioned one end.

3. The combination defined in claim 1 wherein said transistor is connected in common-emitter configuration.

4. The combination defined in claim 1 wherein said transistor is connected in common-base configuration.

5. The combination defined in claim 1 wherein the tank circuit is a coaxial tank circuit having an effective electrical length of $\lambda/4$.

6. The combination defined in claim 5 wherein said output tank circuit is connected directly to the transistor.

7. In a continually tunable amplifier stage operating at ultra high frequencies and having a coaxial line type tank circuit connected to its output, which stage has a transistor as its active element, and wherein, for purposes of neutralizing the susceptance of the transistor, a compensating circuit is provided which circuit is a series circuit composed of a capacitance and an inductance, said circuit being connected in parallel with the susceptance of the transistor, the improvement that:

(a) a portion of said inductance constitutes a coupling loop means, which extends into the tank circuit for coupling out a voltage whose phase is opposite to the phase of the voltage of the outer conductor of the tank circuit, (b) the size of said coupling loop means is small as compared to the shortest wavelength of the tuning range of the amplifier stage, and (c) said coupling loop means is positioned near the current maximum of the tank circuit.

8. A circuit arrangement comprising, in combination:

(a) a transistor having first, second and third electrodes, said first and second electrodes constituting the input electrodes and said second and third electrodes constituting the output electrodes, (b) means for applying an input signal across said input electrodes, (c) a tank circuit connected across said output electrodes, said tank circuit having outer and inner conductors coupled to said second and third electrodes, respectively, and means for tuning said tank circuit over a given band, (d) means for taking an output signal from said tank circuit, and (e) compensating means for neutralizing the inherent susceptance appearing across said input electrodes of said transistor, said compensating means being a series circuit which is composed of a capacitance and an inductance and which is connected across said input electrodes and therefore in parallel with said susceptance, a portion of said inductance constituting a coupling loop means which extends into said tank circuit near the current maximum thereof for coupling out a voltage whose phase is opposite to the phase of the voltage of the outer conductor of the tank circuit in consequence of which there is applied to said susceptance a voltage which is of a phase opposite to that of the voltage appearing across said susceptance, the size of said coupling loop means being small as compared to the shortest wavelength of the band over which said tank circuit may be tuned.

9. The combination defined in claim 8 wherein one end of said coupling loop means is connected to the outer conductor of said tank circuit, and wherein the other end of the loop means which is not connected with said outer conductor is closer to the current maximum than said first-mentioned one end.

References Cited by the Examiner

UNITED STATES PATENTS

| | | | |
|---|---|---|---|
| 2,247,218 | 6/14 | Braaten | 330—76 X |
| 2,681,953 | 6/54 | Bradburd | 330—56 X |

OTHER REFERENCES

Paterson: Article, Motorola Semiconductor Products, Inc., Phoenix, Arizona, AN-100, September 1960, pages 1–6.

ROY LAKE, *Primary Examiner.*

NATHAN KAUFMAN, *Examiner.*